(12) United States Patent
Douskey et al.

(10) Patent No.: US 9,372,232 B2
(45) Date of Patent: Jun. 21, 2016

(54) COLLECTING DIAGNOSTIC DATA FROM CHIPS

(71) Applicant: International Business Machines Corporation, Armonk, NY (US)

(72) Inventors: Steven M. Douskey, Rochester, MN (US); Ryan A. Fitch, Southfield, MI (US); William V. Huott, Holmes, NY (US); Mary P. Kusko, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 14/107,635

(22) Filed: Dec. 16, 2013

(65) Prior Publication Data
US 2015/0168491 A1 Jun. 18, 2015

(51) Int. Cl.
*G01R 31/3177* (2006.01)
*G01R 31/28* (2006.01)
*G01R 31/3185* (2006.01)

(52) U.S. Cl.
CPC *G01R 31/318544* (2013.01); *G01R 31/318541* (2013.01)

(58) Field of Classification Search
CPC ............... G01R 31/318541; G01R 31/318544; G01R 31/3177; G06F 17/5022
USPC ................... 714/716, 736; 702/117
See application file for complete search history.

(56) References Cited

U.S. PATENT DOCUMENTS

| | | | |
|---|---|---|---|
| 6,308,290 B1* | 10/2001 | Forlenza | G01R 31/31853 714/724 |
| 6,442,720 B1* | 8/2002 | Koprowski | G01R 31/31858 714/726 |
| 6,961,886 B2 | 11/2005 | Motika et al. | |
| 7,010,735 B2 | 3/2006 | Motika et al. | |
| 7,376,875 B2 | 5/2008 | Hilgendorf et al. | |
| 7,523,370 B1 | 4/2009 | Keller | |
| 7,908,532 B2 | 3/2011 | Eckelman et al. | |
| 8,006,149 B2* | 8/2011 | Dokken | G01R 31/318547 714/726 |
| 8,086,924 B2 | 12/2011 | Forlenza et al. | |
| 8,566,059 B2* | 10/2013 | Desineni | G06F 11/261 702/117 |
| 8,667,431 B1 | 3/2014 | Douskey et al. | |
| 8,856,720 B2 | 10/2014 | Douskey et al. | |
| 9,285,423 B2 | 3/2016 | Douskey et al. | |
| 2009/0089636 A1 | 4/2009 | Fernsler et al. | |
| 2011/0137602 A1* | 6/2011 | Desineni | G06F 11/261 702/117 |
| 2014/0325298 A1 | 10/2014 | Douskey et al. | |
| 2015/0168490 A1 | 6/2015 | Douskey et al. | |

* cited by examiner

*Primary Examiner* — Phung M Chung
(74) *Attorney, Agent, or Firm* — Scott S. Dobson; Robert Williams

(57) ABSTRACT

A failing latch is identified on a chip including a plurality of latches with the failing latch receiving data propagated from a first set of test input latches. A diagnostic set of latches is determined which includes the failing latch and a set of related latches. The set of related latches each receives data propagated from at least one test input latch from the first set of test input latches. The set of related latches is identified from a related latches data source. One or more tests are performed on the chip and test output data is collected from the diagnostic set of latches. A related latches table may be created by tracing from a target latch.

4 Claims, 9 Drawing Sheets

COLLECTING DIAGNOSTIC DATA FROM CHIPS

BACKGROUND

The present disclosure relates to the field of electronic components and more particularly to testing of electronic components.

Circuits can be prone to defects introduced during a manufacturing process. To test for defects, a scan input may be applied to scan channels, and the result of the scan input that is applied to the scan channels may be analyzed. The test may include large numbers and variations of scan inputs being applied to scan channels of the circuit. The tests may take a great amount of time, produce large amounts of data for analysis, and require large amounts of resources for that analysis.

SUMMARY

Disclosed herein are embodiments of a method for collecting diagnostic data from a chip including a plurality of latches. The method includes identifying a failing latch. The failing latch receives data propagated from a first set of test input latches. The method further includes determining a diagnostic set of latches. The diagnostic set of latches includes the failing latch and a set of related latches. The set of related latches each receives data propagated from at least one test input latch from the first set of test input latches. The set of related latches is identified from a related latches data source. The method further includes performing one or more tests on the chip. The method further includes collecting test output data from the diagnostic set of latches. The test output data is produced during the one or more tests.

Also disclosed herein are embodiments of a method for creating a related latches table for a chip including a plurality of latches. The method includes selecting a target latch. The method further includes tracing data input from the target latch back to a first set of source latches. The method further includes tracing data propagation from the first set of source latches to a set of sink latches. The set of sink latches includes the target latch and related latches. The method further includes recording the related latches in the related latches table for the target latch.

DETAILED DESCRIPTION

A number of defects may be created during the manufacturing of a digital integrated circuit (IC). These defects may affect the logic output of the digital IC, which in turn adversely influences semiconductor chip quality and costs. Industry has developed a number of testing techniques to test for the defects. These techniques may rely on a test structure built into a chip. Cycling and analyzing output from the circuits on the chip may be time consuming and resource intensive. In embodiments of the presented invention, a storage may be in communication with a scan channel. The storage may store one or more selected bits unmodified of a scan channel during a scan out of the scan channel. In some embodiments the storage may be referred to as a "snapshot". Since the organizing and analysis of the complete test data is very time consuming the storage of the selected bits may reduce the number, variety, or time of testing done to the chip. The stored unmodified bit may be analyzed while test is being completed and may be used to focus current analysis of data or future testing to be done.

The test structure may connect to individual scan channels. An input, sometimes known as a test vector, from the test structure may produce an output on the scannable latches. In various embodiments, the output of the scannable latches may be compared against an expected result for the circuit being tested. The comparison may be done by an analysis system in communication with the scan channel. In some embodiments, the test structure may be part of a Logic Built In Self Test (LBIST) system.

Figure 1:
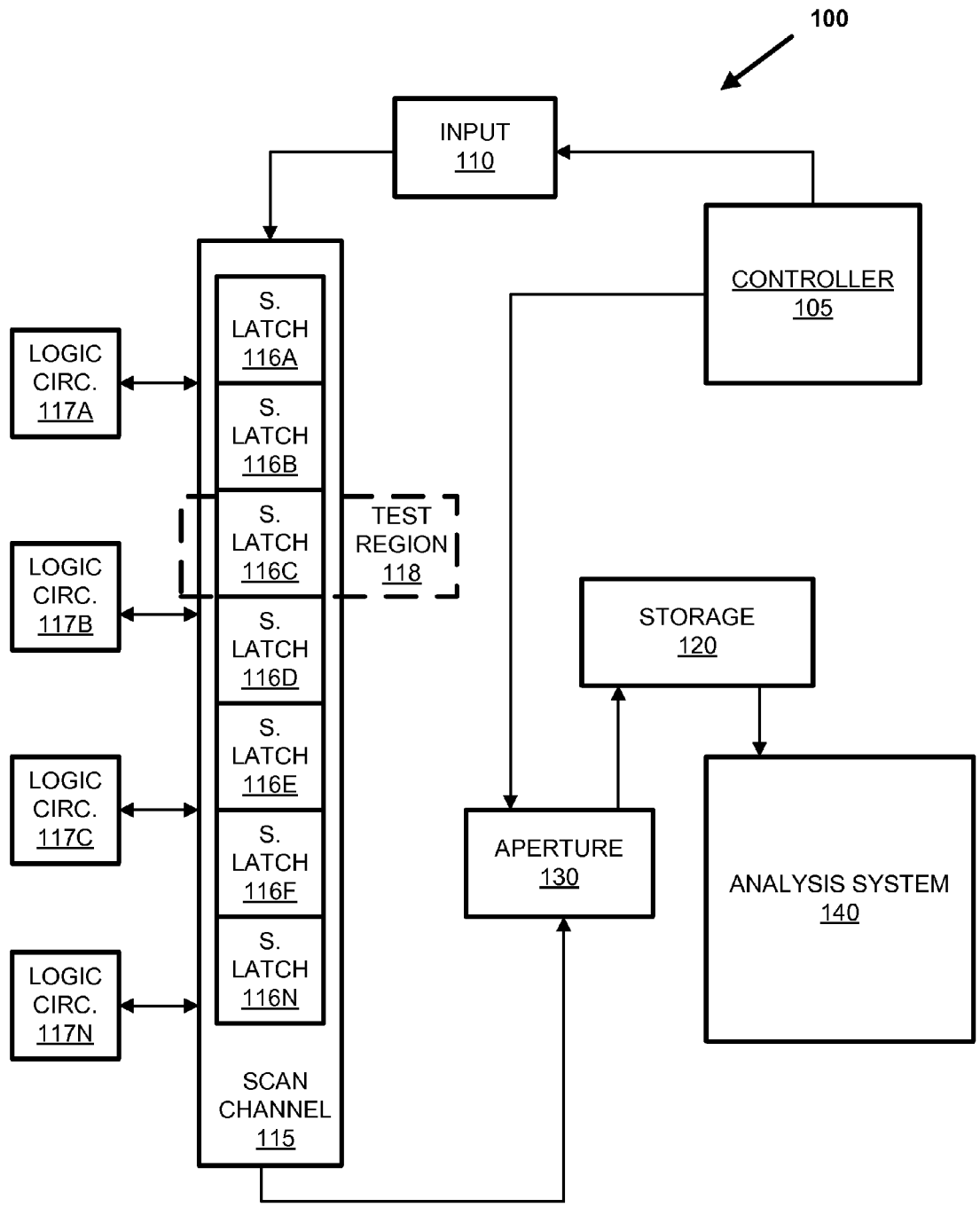
FIG. 1 depicts a high-level block diagram of an exemplary test structure, according to an embodiment.

FIG. 1 shows an embodiment of a test structure 100 that may be used to test a scan channel 115 on a chip. The test structure 100 may include controller 105 managing an input 110, or scan input data, to scan channel 115, the output, or scan out, of which may be reviewed by an analysis system 140. In various embodiments, a test system may be referred to as an analysis system. The test structure may also contain an aperture 130 and a storage 120. Storage 120 may store unmodified one or more selected bits of scan channel 115 during a scan out of scan channel 115. The aperture 130 may be defined by the controller 105 to select the bit to store in storage 120.

In some embodiments, controller 105 may manage input 110, aperture 130, and storage 120 of test structure 100. In various embodiments, controller 105 may create and transmit input 110 to scan channel 115. In other embodiments, input 110 may be created in another element in test structure 100 that is in communication with controller 105. Input 110 may be called scan input data in some embodiments. In various embodiments, the input may have expected results when scanned by circuits on a chip, such as the scannable latches 116a-116n of scan channel 115. The controller may also manage storage 120. In various embodiments this may include selecting the bit or bits to be stored during a scan out of scan channel 115 by defining the aperture 130 which is used on the scan out of the scan channel 115.

Scan channel 115 may include scannable latches 116a-116n (generally referred to as 116). In various embodiments the scan channel may include any number of scannable latches 116. In various embodiments, scannable latches 116 may be referred to as a logic element. Scannable latches 116a-116n may be in communication with logic circuits 117a-117n (generally referred to as 117) on a chip. Logic circuits 117 do not have to be of equal number to scannable latches 116. In various embodiments, logic circuits 117 may be used, assigned, or in communication with specific scannable latches 116 or they may be shared by scannable latches 116 of scan channel 115. Scannable latches 116 may be configured to scan input 110 to apply it to logic circuits 117 on a chip. The scannable latches 116 may be configured to receive the output, or outputs, from the logic circuits 117 of the chip.

The scan out of scan channel 115 may include the transmittal of the outputs from logic circuits 117 received by scannable latches 116 based off input 110, or scan input. The transmittal of the outputs may be directed or sent to analysis system 140. In the illustrated embodiment, the output may pass through storage 120. Controller 105 may manage storage 120 and select one or more bits, depending on the size of the storage 120, bit of the scan out of scan channel 115 to store. In various other embodiments, storage 120 or aperture 130 may be managed by analysis system 140 or another entity within or in communication with test structure 100. In various embodiments, the output may have multiple paths, or channels, of transmittal and may not need to pass through aperture 130 or storage 120 to reach analysis system 140.

In the illustrated embodiment, a test region 118 may be the scan output, or part of the scan output that is to be stored, or retained, in the storage 120. For example, controller 105 may transmit an input 110 to scan channel 115. Scan channel 115 may distribute the input across logic circuits 117 of a chip, and scannable latches 116 may be configured to receive output from logic circuits 117. Controller 105 may manage aperture 130 such that storage 120 stores the bit, or result, from the output of logic circuits 117 to scannable latch 116C unmodified during a scan out of scan channel 115. In various embodiments, storage 120 may retain any bit from any of scannable latches 116 of scan channel 115, or phrased another way, any of scannable latches 116 may be test region 118. In various embodiments, storage 120 may retain bits from multiple scannable latches 117, or retain the copies of the same bit multiple times, in multiple locations in storage 120. In various embodiments, the selected bit may be stored unmodified, such as without compressing the bit during the scan out of the scan channel.

In the illustrated embodiment, the data stored in storage 120 may be accessed by the analysis system 140. In other embodiments, a variety of entities are contemplated as having access to storage 120. This may include, but is not limited to, entities of an LBIST system, external testing system, or non-volatile data storage. The analysis system 140 access to the data, or "snapshot", in storage 120 may allow for analysis that may direct additional testing. In various embodiments, storage 120 may be a volatile or non-volatile memory. For example, storage 120 may be a latch. In other embodiments, the storage 120 may be a shift register. In another example the storage 120 may be a flash memory. Storage 120 may be any element or device capable of communicating with scan channel 115 and storing the bit of data from the scan out of scan channel 115.

Figure 2A:
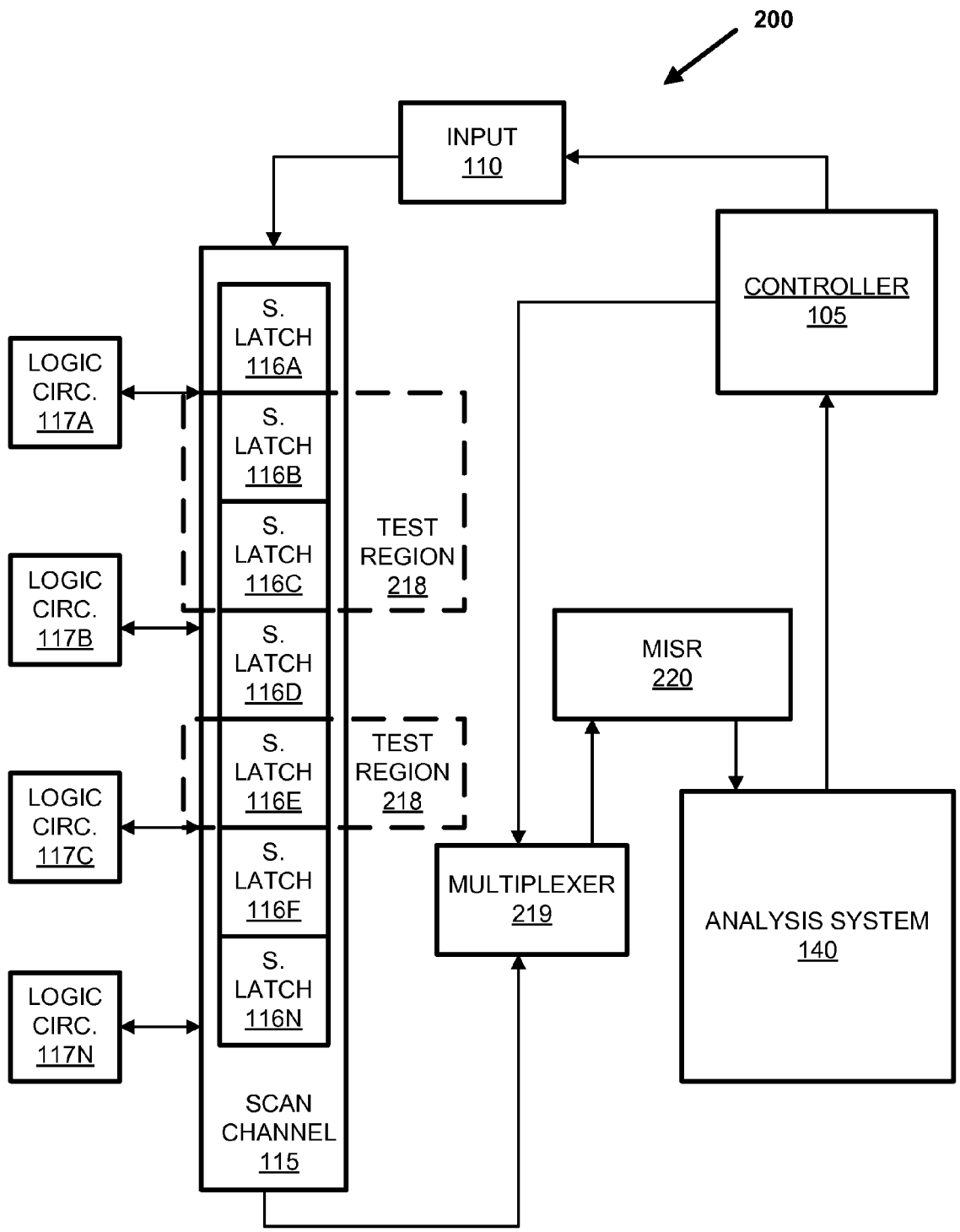
FIG. 2A depicts a high-level block diagram of an exemplary test structure, according to an embodiment.

FIG. 2A shows an embodiment of a test structure 200 that may be used to test a scan channel 115 on a chip. Test structure 100 may include controller 105 managing an input 110, or scan input data, to scan channel 115 the output, or the scan out, of which may be reviewed by an analysis system 140. Test structure 200 may also contain a multiplexer 219 and a Multiple-input Signature Register (MISR) 220 that may be used to store one or more selected bits of scan channel 115 during a scan out of scan channel 115. Elements and entities with matching numbers to FIG. 1 may be equivalent to those described in FIG. 1 and may be considered to act and interact in a similar way.

In this embodiment, the combination of multiplexer 219 and MISR 220 may be used to store data, or bits, from the scan out of scan channel 115. MISR 220 may be modified to act as a signature register. This modification may include disabling exclusive-OR gates in the MISR 220 so that the bits are stored unmodified. MISR 220 may typically be used to compress data received from the scannable latches 116. MISR 220 may typically receive data from several scan channels 115 at the same time. In the illustrated embodiment, multiplexer 219 may be used to process scan out data from test region 218 and organize is it to be entered into MISR 220 for storage. In various embodiments, the aperture 130 may be incorporated into the multiplexer 219 or may remain a separate element. In various embodiments, multiplexer 219 may process the selected bit for storage in MISR 220. For example, controller 105 may inhibit feedback in MISR 220 and clock selected latch values into MISR 220 as the selected latch positions are scanned out of scan channel 115.

In the illustrated embodiment, the test region includes scannable latches 116B, 116C, and 116E. They are exemplary only. In practice, any individual or combination of scannable latches 116 may be part of the test region stored in the scan out. In various embodiments, multiple multiplexers 219 or MISR 220 may be available to be used. In various embodiments, a combination of MISR 220 and other forms of storage, such as individual latches, may be used in combination. The test region, or selected bits, to be stored during the scan may not exceed the storage capabilities of the total storage available such as the individual MISR 220 in FIG. 2B. In normal mode, the MISR may include feedback to "compress" data being scanned into it. In the test mode of the various embodiments where the MISR 220 is used to store unmodified bits, feedback is inhibited so that the one or more bits from selected scannable latches are not compressed.

Figure 2B:
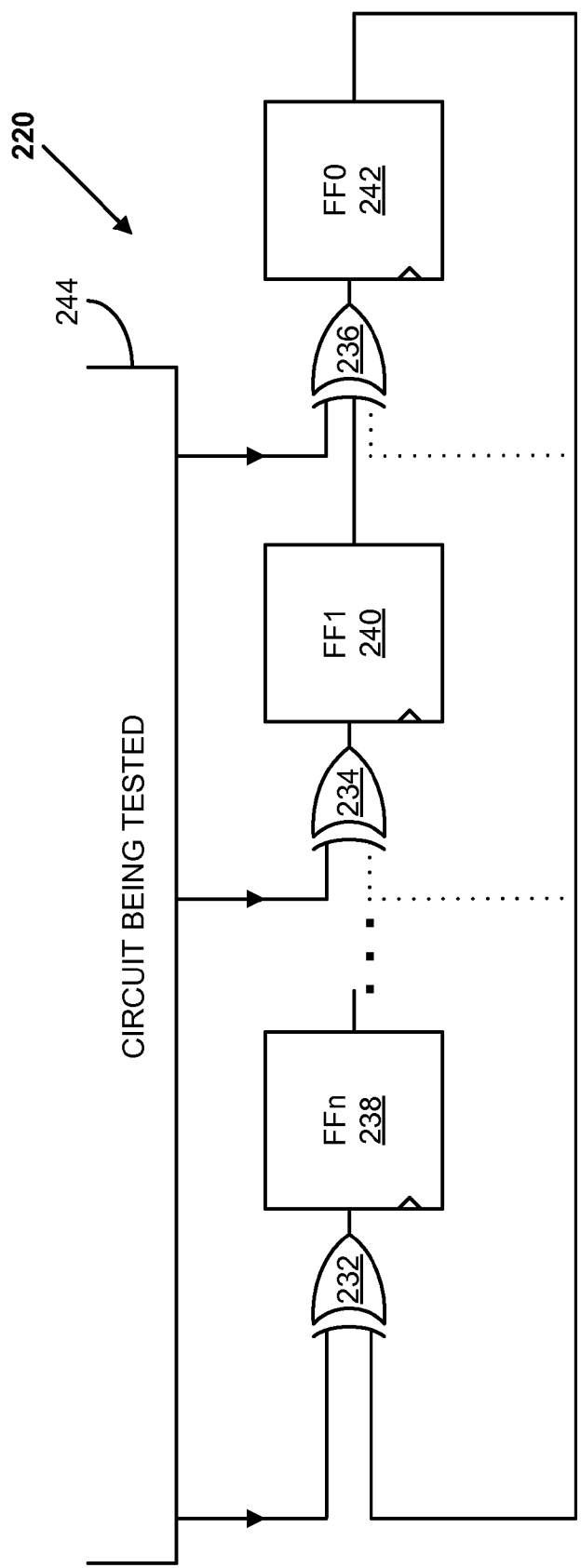
FIG. 2B depicts a high-level block diagram of an exemplary MISR structure, according to an embodiment.

FIG. 2B depicts a high-level block diagram of an exemplary MISR 220 structure, according to an embodiment. In normal operation, the MISR 220 may input a vector of test response values in parallel from a circuit being tested, integrate those values with a value of current state of the MISR 220, and leave the result in the MISR 220 for integration with the next vector of test response values. If any single test response value from the circuit turns out to be inaccurate due to a circuit fault, the state of the MISR 220 is affected such that a final result, sometimes known as the "signature", will not be the same as an expected result.

Specifically, the MISR 220 shown in FIG. 2B includes a sequence of n exclusive-OR gates 232, 234, and 236 that each output to a corresponding flip-flop 238, 240, and 242 respectively, where n equals the number of flip-flops in the MISR 220. Further, each exclusive-OR gate 232, 234, and 236 has an input connected to a corresponding test response value from a circuit being tested 244. In the test mode of the various embodiments where the MISR 220 is used to store unmodified bits, the exclusive-OR gates 232, 234, and 236 may be disabled so that the one or more bits from selected scannable latches are not hashed or modified when stored.

A characteristic polynomial of a MISR 220 indicates which flip-flops in the MISR 220 are subject to feedback. Feedback is often created in a MISR 220 to increase the number of states that the MISR can transition through. For example, in FIG. 2B, FF1 and FF0, 240 and 242 respectively, could be subject to feedback by connecting a third input of the corresponding exclusive-OR gates, 234 or 236 respectively, to an output of FF0 242 (shown by dotted lines in FIG. 2B). In the test mode of the various embodiments where the MISR 220 is used to store unmodified bits, the feedback may be disabled or prevented so that the one or more bits from selected scannable latches are not compressed or modified when stored.

In various embodiments, the controller 105 may control the clock, effectively preventing inputs from the circuit 244 to the MISR 220. The controller 105 may inhibit the control clock using the multiplexer 219 in some embodiments. This may allow for the data to be stored in the MISR 220 without it being replaced, or lost, as testing continues.

Figure 3:
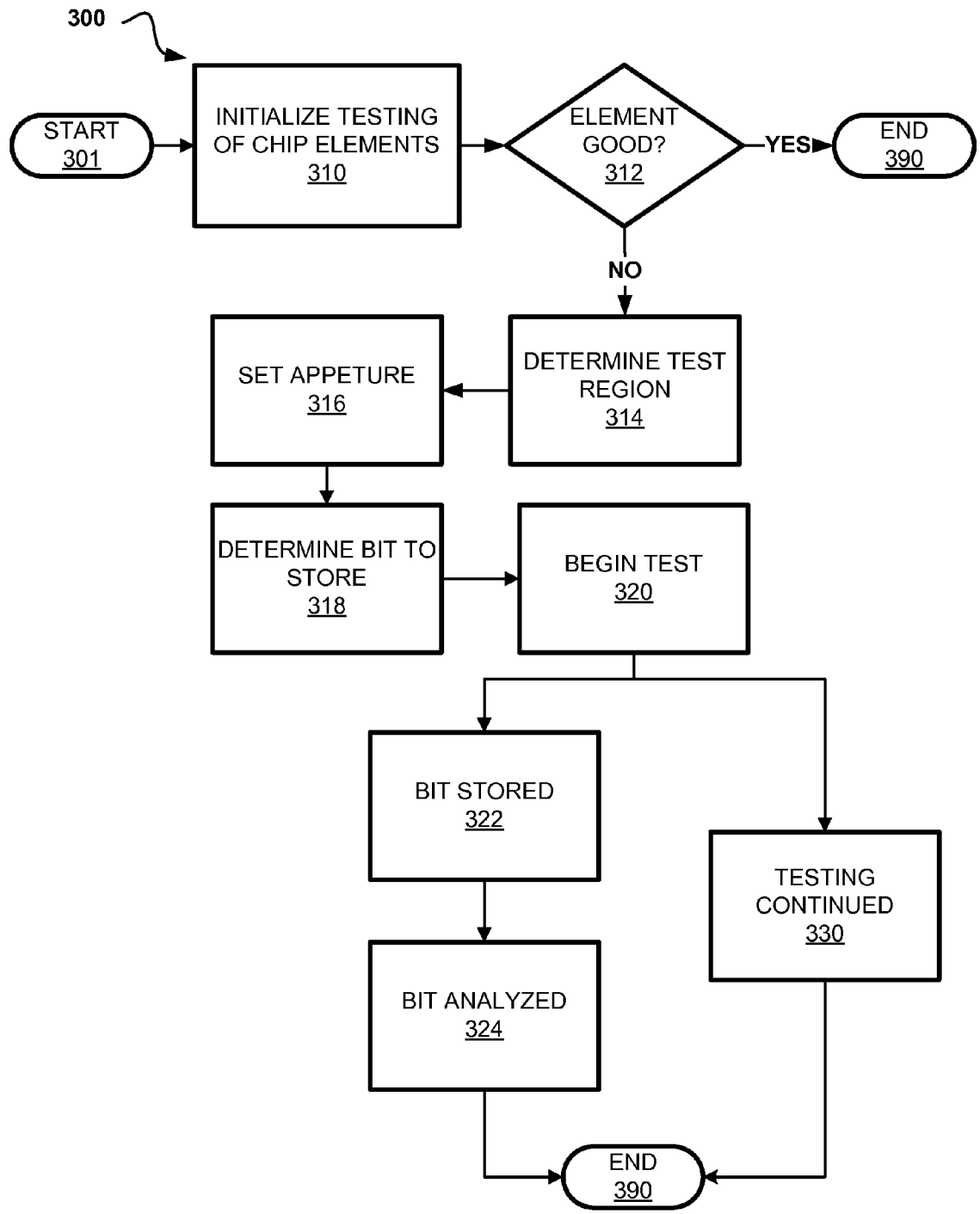
FIG. 3 is a flowchart illustrating a method for testing a chip, according to an embodiment.

FIG. 3 is a flowchart illustrating a method 300 for testing a scan channel and uses a storage to store a selected bit of the scan out of the scan channel, according to an embodiment of the invention. The method 300 may start at block 301. In block 310, testing is initialized of chip elements. This testing may include one or more scan channels for circuits on the chip. In various embodiments, the testing may be initialized by a variety of entities internal and external to the chip. For example the testing may be initialized by or due to, but not limited to, a programmed testing schedule, an error in output from the chip being detected, or an external testing device activating a testing cycle. In block 312, a determination is made if the element tested as "good", or passed initial testing. If the element tested as "good" method 300 may proceed to block 390 and end. If the element did not test as "good", or did not pass the initial test, method 300 may proceed to block 314. In block 314, a test region is determined for further testing. In various embodiments this may include one or more scan channels. The scan channel may be selected due to previous testing indicating that it may have a failure. The scan channel may also be selected due to a process of elimination, for example a progressive scan through a region or section of the chip. The continued, specific, or directed testing may include testing of greater variety or detail than the initial testing in block 312.

In block 316, an aperture may be set for scanning the scan channel. This aperture may restrict, limit, or mask various scannable latches 116 of the scan channel 115 that may be involved in an individual test, test cycle, or part of a test cycle. With the aperture set the bit to be stored in storage 120 during the scan out of the scan channel 115, the method may continue to block 318. The aperture may be set by the controller 105 or by another element of or in communication with test structure 100. In block 318, the bit to be stored in storage 120 may be determined. In various embodiments, the bit selected may be a specific output from one or more scannable latches 116 of scan channel 115. In various embodiments, the selection of a bit to be stored may be done by the controller 105, analysis system 140, or another element of or in communication with the test structure 100. In various embodiments, blocks 318 and 316 may be reversed or may occur simultaneously.

In block 320, testing may begin on the chip, or more specifically the scan channel 115. The testing may include scanning input data into scannable latches 116. The scannable latches 116 may be configured to apply the scanned input data to logic circuits 117 on the chip and to receive output back from logic circuits 117. The output back from the logic circuits 117 now in scannable latches 116 may now be scanned out. During the scan out one or more bits of the scan out of scan channel 115 may be stored in storage 120. In block 322, the selected bit, or bits, may be stored in storage 120 during the scan out of scan channel 115. In block 324, the bit, or bits, stored in storage 120 may be analyzed by analysis system 140. Concurrently, in block 330, testing may continue of scan channel 115. In various embodiments, the analysis of the stored bit may be used direct, modify, or select the continued testing or future testing of scan channel 115 or other scan channels. The method 300 may then end in block 390.

In various embodiments, activities of method 300 may be eliminated, combined, or more numerous than illustrated. For example, in some embodiments, initial testing of block 310 and determinations of block 312 and 314 may be absent. The testing and storage of a bit of the scan out of scan channel 115 may be part of a regular test, or test schedule, and not based off a failure determination.

Figure 4:
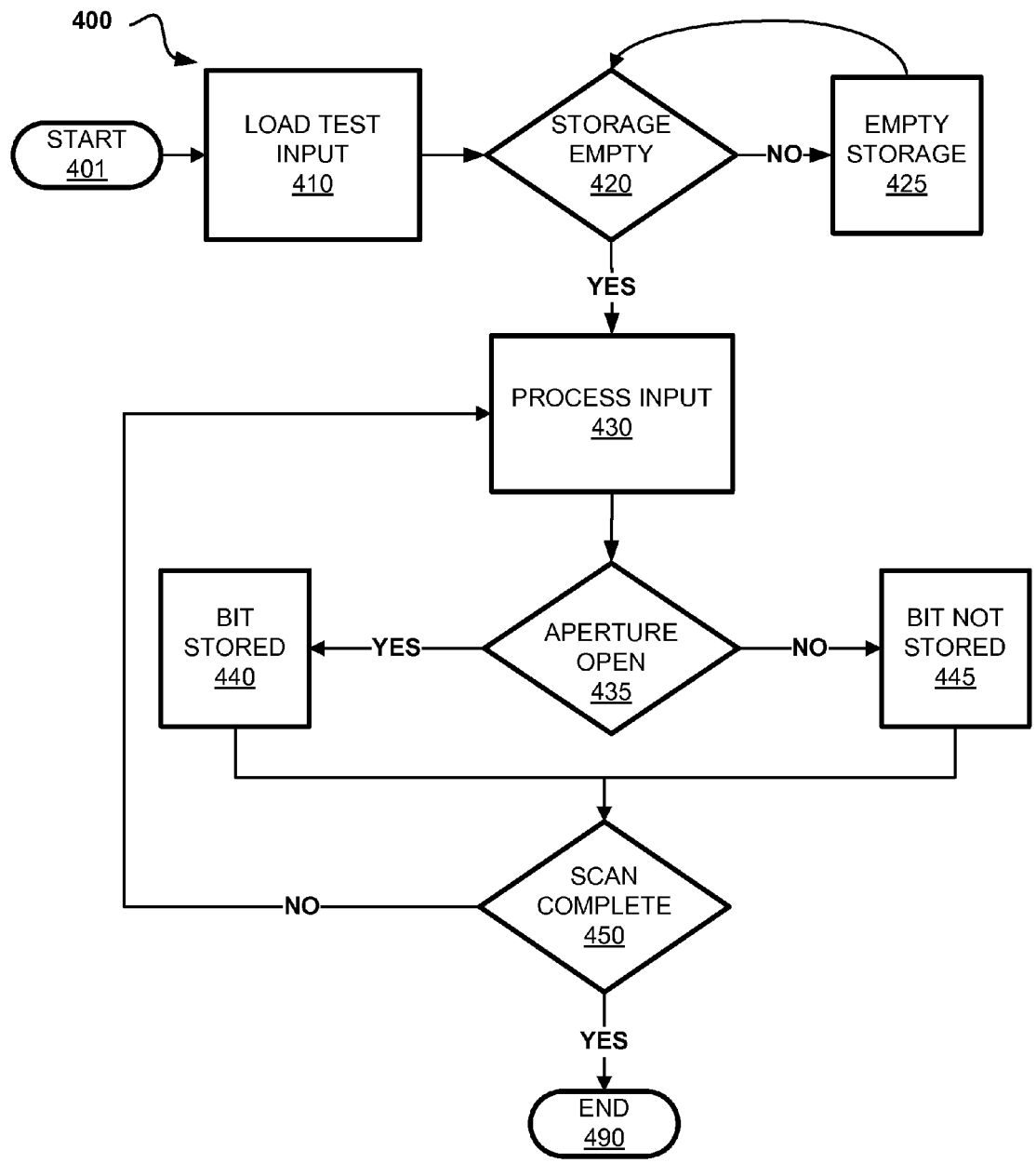
FIG. 4 is a flowchart illustrating a method for testing a chip, according to an embodiment.

FIG. 4 is a flowchart illustrating a method 400 for testing a scan channel and uses a storage to store a selected unmodified bit of the scan out of the scan channel, according to an embodiment of the invention. The method 400 may start at block 401. In block 410, the test input is loaded into the scan channel. For example this may include the scanning in of input 110 to scan channel 115. In block 420, the controller 105 may check to determine if the storage 120 is empty or available for storing when the scan out of the scan channel 115 occurs. If the storage is not empty then the method may proceed to block 425. In block 425, the storage 120 may be emptied. The emptying of the storage is discussed in more detail below. The method may proceed back to block 420 to confirm the availability of the storage 120.

If the storage is empty in block 420 is the method may proceed to block 430. In block 430, the input is processed by scan channel 115. This may include the scan out of scan channel 115. During the scan out of the scan channel 115 the method may, in block 435, determine if aperture 130 is open. If the answer is "Yes" the method may proceed to block 440. In block 440, the aperture is open allowing the bit being scanned out to be stored in storage 120. If the answer is "No" the aperture is closed and in block 445 the bit is not stored in storage 120. Both block 440 and 445 may proceed to block 450. In block 450 the method determines if the scan out is complete. If the answer is "No" the method proceeds to block 430 and for the next bit of the scan out is processed through. If the answer is "Yes" the method may proceed to block 490 where the method may end. Method 400 is exemplary only, and it is contemplated that various embodiments may eliminate, multiply, or rearrange steps of the illustrated method. For example the storage may be large enough to allow more data collection when the storage is not yet empty. Also with a large enough storage the process can continue to the next test while the storage is being read from one or more previous tests.

Figure 5:
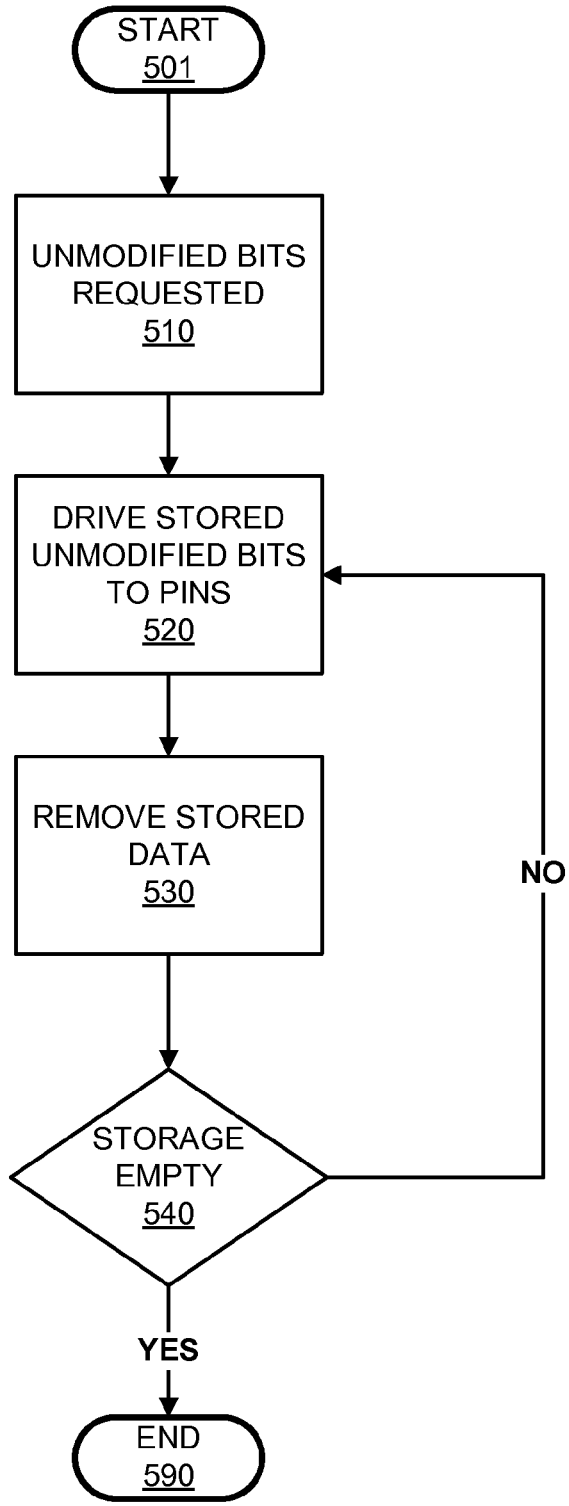
FIG. 5 is a flowchart illustrating a method for sending bits to a tester, according to an embodiment.

FIG. 5 is a flowchart illustrating a method for sending bits to a tester, according to an embodiment. In various embodiments, this may be how the storage 120 is emptied in block 425 of FIG. 4. The method 500 of FIG. 5 may start in block 501. In block 510 the unmodified bits in storage 120 may be requested by the tester, for example analysis system 140. In block 520, the unmodified bits stored may be driven to output pins in communication with the analysis system 140 and sent to the analysis system 140. In various embodiments, a verification of the validity or need for the bits stored in the storage 120 may be made. The sending of the selected unmodified bits from the storage to the tester may be done at a tester speed. In various embodiments, the sending of bits at tester speed may be balanced with rate of storing the unmodified bits in the storage 120. For example, the tester may pull or request the bits and test them at a rate balanced with the rate that bits from a scan out may be stored at. In various embodiments, the sending of the bits may occur upon the completion of the test, rather than occurring during testing.

In block 530, the bits, or data stored in the storage may be removed or invalidated. In various embodiments, this may result in standardized data or setting being inputted to the storage. For example, setting all the latches in the storage to a value of "0" or "1". In other embodiments, this may result in permission being granted to or by an entity such as the controller 105 to open the aperture 130 and overwrite data existing in the storage 120. In block 540, the emptying of the storage 120 may be confirmed. If the storage is not empty, or available to receive bits from a scan out the method may return to block 520 and attempt to distribute, transmit, send, or remove stored bits. If the storage is considered empty in block 540 the method may proceed to block 590 where the method may end.

Embodiments of the present invention may allow for diagnostic data collection focused on failing latches and latches related to the failing latches. This may allow for a smaller volume of data to be collected and loaded into a test diagnostic tool. Some embodiments may allow for use of a specially configured fault model based on the failing latches.

A related latches data source may be used to identify which latches to collect data from for processing by a diagnostic tool. The related latches data source may contain a related latches table with a list of latches, and, for each specific latch, a list of related latches which receive data propagated from at least one latch which propagates data to the specific latch. In some embodiments, the table may contain an aperture ranges for each specific latch which include the related latches. The table may be created once the chip is manufactured as this information may be constant for the design. The information for the table may be obtained using known tracing methods to trace paths between latches.

Once a failing latch is identified, the related latches data source may be used to identify related latches. The failing latch and the related latches may be referred to as the diagnostic set of latches. A test may be run and data may be collected from the diagnostic set of latches. The data collected may be loaded into a test diagnostic tool, along with the test input data, to determine possible faults.

In another example, once a failing latch is identified, the related latches data source may be used to identify an aperture range. The aperture range may include the endpoints of a range of latches which include the diagnostic set of latches. The aperture range may also include additional latches. A test may be run and data may be collected from the aperture range. The data collected may be loaded into a test diagnostic tool, along with the test input data, to determine possible faults.

The methods and systems described in FIGS. 1-5 may be used to obtain the data for the diagnostic set of latches. The data from diagnostic set of latches may be obtained during a separate test for each individual latch or during fewer tests by collecting from a range of latches using various aperture ranges which mask data outside of the aperture range. For example, the aperture range may be set to obtain data for a specific latch for each test cycle or may include multiple latches which include at least the diagnostic set of latches. The methods described herein for obtaining data from specific latches are provided only as an example. Any method now known or developed in the future could be used.

In some embodiments, the related latches data source may further contain a list of test input latches which may be used to create a fault model to be run by the diagnostic tool. The related latches data source may contain, for each specific latch, test input latches which feed into the diagnostic set of latches for the specific latch. Using this information, a fault model may be created which is configured to find the possible faults specific to causing the failing latch.

Figure 6:
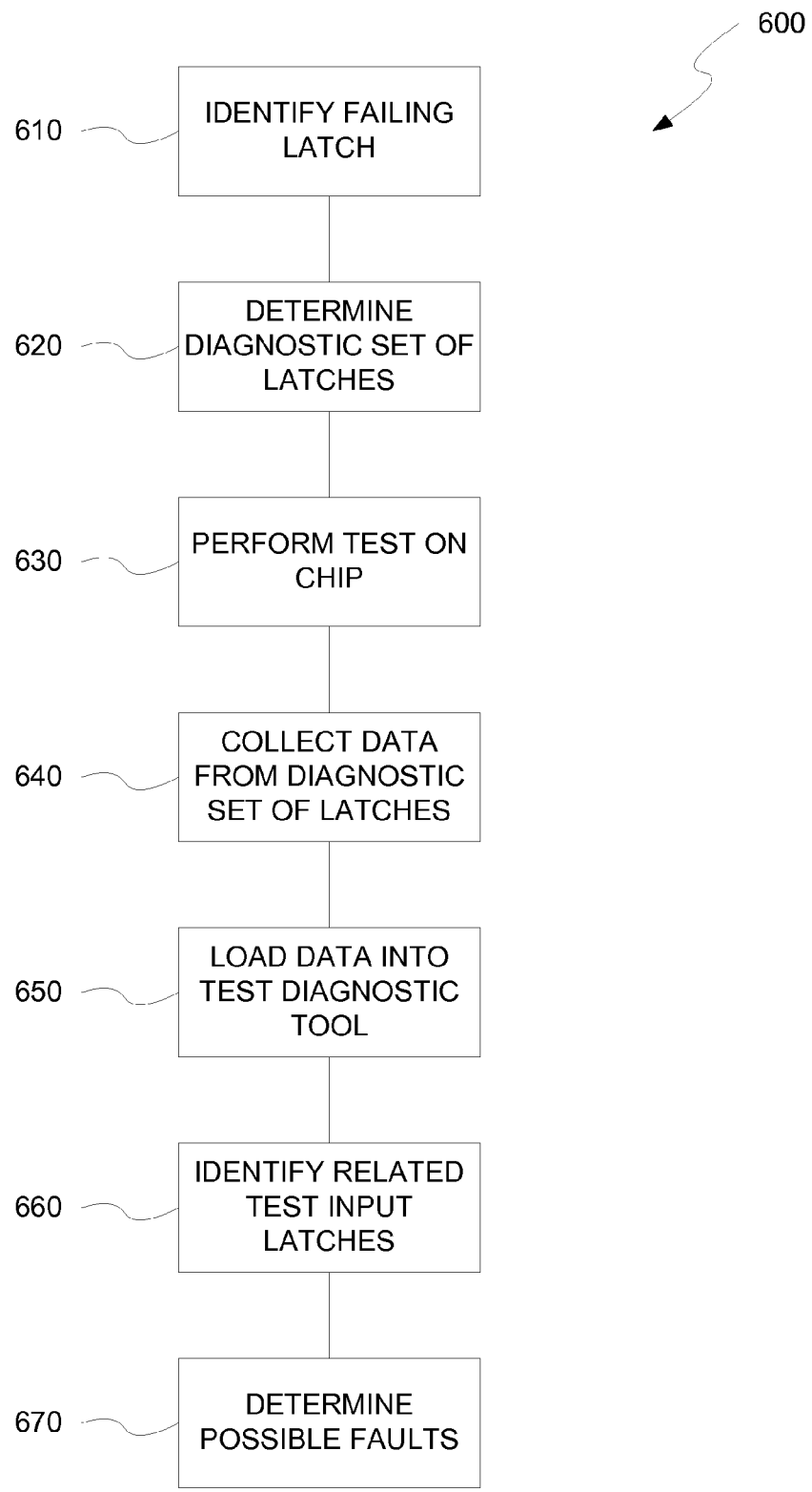
FIG. 6 depicts a flow diagram of an example method for collecting diagnostic data from a chip.

Referring to FIG. 6, an example method 600 for testing a chip including a plurality of latches is depicted. At step 610, a failing latch is identified. The latch may have been determined to be failing using any method. The failing latch receives data propagated from a set of test input latches. At step 620, a diagnostic set of latches is determined which includes the failing latch and a set of related latches. The set of related latches may be identified from a related latches data source. The related latches may receive data propagated from the set of input latches which propagated data to the failing latch. The related latches data source may be a data file which contains a table with related latches for each latch on the chip. In some embodiments, an aperture range may be determined. The aperture range may be identified from the related latches data source.

At step 630, a test may be performed on the chip. The test may include loading test input patterns into test input data latches. At step 640, test output data may be collected from one or more latches in the diagnostic set of latches. This data may be collected using any method or structure including those disclosed in FIGS. 1-5. Steps 630 and 640 may be repeated until data is collected from all of the latches in the diagnostic set of latches. At step 650, the collected data may be loaded into a test diagnostic tool. The test input patterns from the tests may also be loaded into the test diagnostic tool.

At step 660, a second set of related test input latches may be identified. The second set of related test input may be latches which propagate data to the diagnostic set of latches. The related test input latches may be identified from the related latches data source. The related latches data source may contain a list of test input latches which propagate data to the diagnostic set of latches for each latch on the chip. At step 670, possible faults on the chip are determined by the test diagnostic tool using a fault model. The fault model may be configured based on the second set of related test input latches and the diagnostic set of input latches. In some embodiments, a total fault model for the entire chip may be used.

Figure 7:
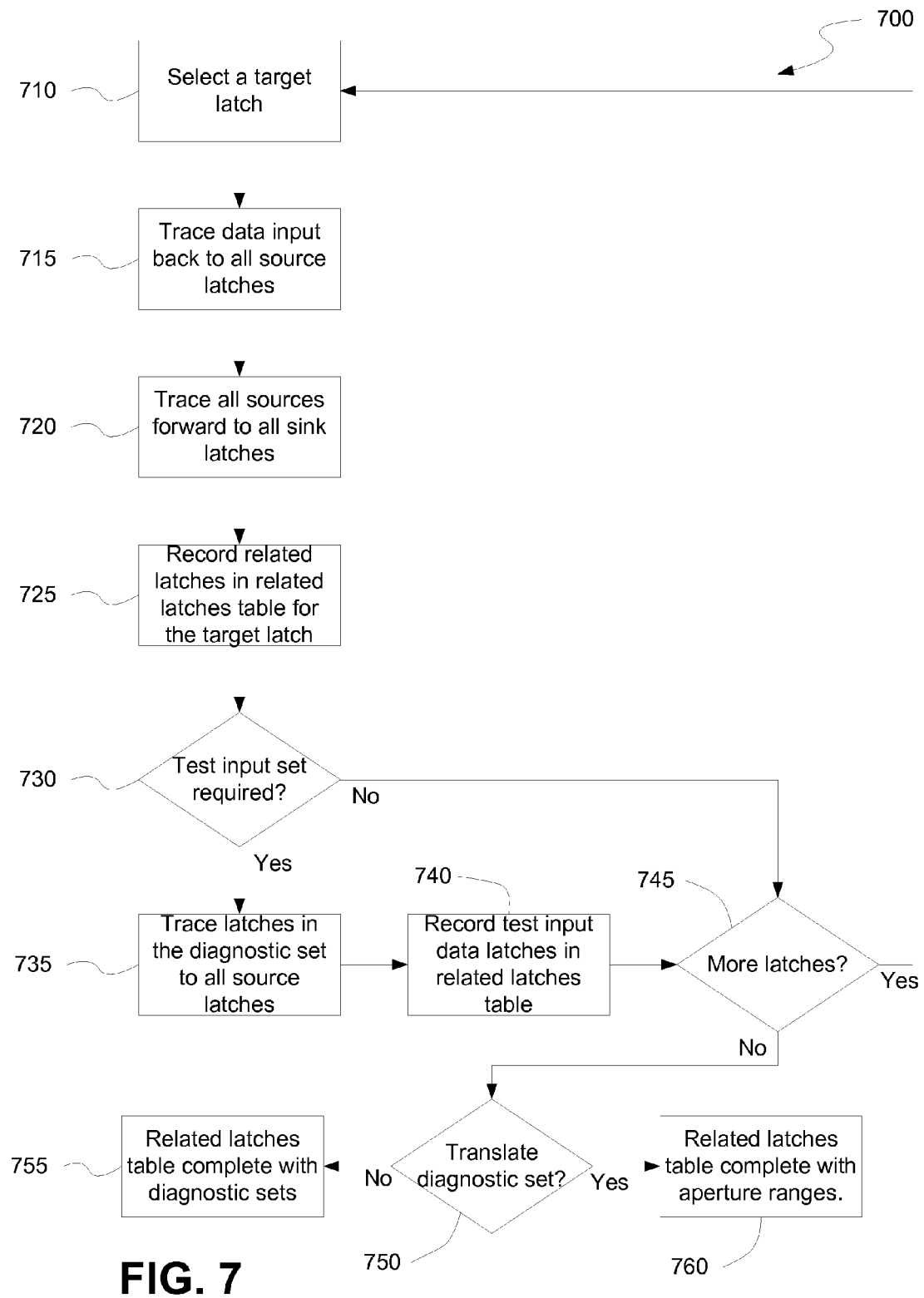
FIG. 7 depicts an example method for creating a related latches table.

Referring to FIG. 7, an example method 700 for creating a related latches table is depicted. At step 710, a target latch may be selected. At step 715, the data input may be traced from the target latch back to all source latches. At step 720, the source latches may be traced forward to all sink latches. The sink latches may be the diagnostic set of latches for the target latch where the diagnostic set includes the target latch and related latches. At step 725, the diagnostic set of latches may be recorded in a related latches table for the target latch. In some embodiments, only the related latches may be recorded.

At step 730, it may be determined whether the test input latches related to the diagnostic set are also being recorded in the related latches table. If the related test input latches are not included in the related latches table, the method may proceed to step 745. If the related test input latches are included in the table, the method may proceed to step 735.

At step 735, the data input may be traced from the diagnostic set of latches to all source latches. The source latches may be the related test input latches. At step 740, the related test input latches may be recorded in the related latches table for the target latch.

At step 745, it may be determined if there are more latches to complete the related latches table. If there are more latches, the method may proceed back to step 710. If the table is complete, the method may proceed to step 750.

At step 750, it may be determined whether the diagnostic set for each target latch will be translated into an aperture range. If the diagnostic sets are not translated, the method may proceed to step 755 and related latches table may be complete with a list of related latches for each target latch. If the diagnostic sets are translated, the method may proceed to step 760 and the related latches table may be complete with an aperture range for each target latch which includes the diagnostic set of latches.

Figure 8:
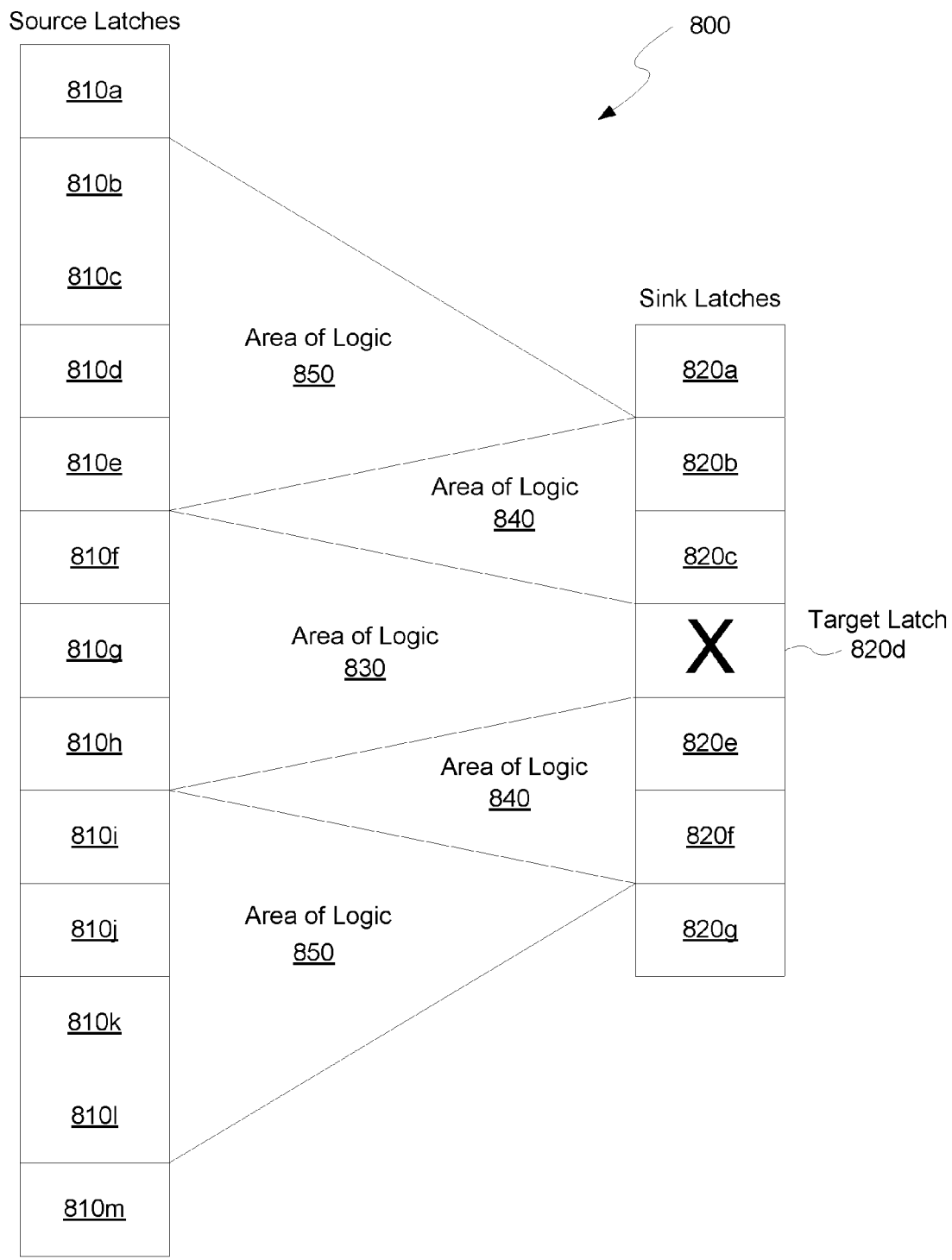
FIG. 8 depicts an example representation of a set of source latches, a set of sink latches, and areas of logic between the latches.

Referring to FIG. 8, an example representation 800 of source latches 810*a-m*, sink latches 820*a-g*, and areas of logic between them 830, 840, and 850 are depicted. As illustrated, latch 820*d* is the target latch. Area of logic 830 represents the logic elements which feed into latch 820*d*. Thus, tracing from target latch 820*d* to all source latches would result in source latches 810*f-h*.

Areas of logic 830 and 840 represent the logic elements which propagate data from source latches 810*f-h*. Thus, tracing forward from source latches 810*f-h* to all sink latches would result in sink latches 820*b-f*, the diagnostic set of latches. The diagnostic set of latches includes target latch 820*d* and related latches 820*b,c,e,f*.

Areas of logic 830, 840, and 850 represent logic elements which feed into the diagnostic set of latches. Thus, tracing from the diagnostic set of latches back to all source latches would result in source latches 810*b-1*, the related test input latches.

A related latch data table for example representation 800 may list, for target latch 820*d*, related latches 820*b,c,e,f* and related test input latches 810*b-1*. In some embodiments, the related latches table may include an aperture range of 820*b-f* for target latch 820*d*.

While the invention has been described with reference to the specific aspects thereof, those skilled in the art will be able to make various modifications to the described aspects of the invention without departing from the true spirit and scope of the invention. The terms and descriptions used herein are set forth by way of illustration only and are not meant as limitations. Those skilled in the art will recognize that these and other variations are possible within the spirit and scope of the invention as defined in the following claims and their equivalents.

What is claimed is:

1. A method for collecting diagnostic data from a chip including a plurality of latches, the method comprising:
    identifying a failing latch from the plurality of latches, the failing latch receiving data propagated from a first set of test input latches;
    determining, in response to identifying the failing latch, a diagnostic set of latches, the diagnostic set of latches comprising the failing latch and a set of related latches, the set of related latches each receiving data propagated from at least one test input latch from the first set of test input latches, the set of related latches identified from a related latches data source;
    performing, after determining the diagnostic set of latches, one or more tests on the chip;
    collecting test output data from the diagnostic set of latches, the test output data produced during the one or more tests;
    loading the collected test output data into a diagnostic tool; and
    determining, by the diagnostic tool, possible faults using the test output data and a fault model.

2. The method of claim 1, wherein the related latches data source comprises a related latches table.

3. The method of claim 1, wherein the fault model is configured based on the diagnostic set of latches and a second set of related test input latches, the second set of related test input latches comprising test input latches which propagate data to at least one latch in the diagnostic set of latches.

4. The method of claim 3, wherein the second set of related test input latches is identified from the related latches data source.

* * * * *